US007285998B2

(12) United States Patent
Matsuoka

(10) Patent No.: US 7,285,998 B2
(45) Date of Patent: Oct. 23, 2007

(54) DUTY RATIO ADJUSTING CIRCUIT

(75) Inventor: Yoshitaka Matsuoka, Tokyo (JP)

(73) Assignee: NEC Corporation, Tokyo (JP)

( * ) Notice: Subject to any disclaimer, the term of this patent is extended or adjusted under 35 U.S.C. 154(b) by 37 days.

(21) Appl. No.: 11/388,093

(22) Filed: Mar. 23, 2006

(65) Prior Publication Data

US 2006/0214713 A1 Sep. 28, 2006

(30) Foreign Application Priority Data

Mar. 25, 2005 (JP) ............................ 2005-088787

(51) Int. Cl.
*H03K 3/017* (2006.01)

(52) U.S. Cl. ...................................... 327/175; 327/172

(58) Field of Classification Search ................ 327/172, 327/175

See application file for complete search history.

(56) References Cited

U.S. PATENT DOCUMENTS 4,596,954 A * 6/1986 Haque ........................ 327/116
5,907,254 A * 5/1999 Chang ........................ 327/165
6,998,894 B2 * 2/2006 Lee et al. .................. 327/172

FOREIGN PATENT DOCUMENTS

| | | |
|---|---|---|
| JP | 5-29893 | 2/1993 |
| JP | 9-214307 | 8/1997 |
| JP | 2003-243973 | 8/2003 |

* cited by examiner

*Primary Examiner*—Kenneth B. Wells
(74) *Attorney, Agent, or Firm*—Michael Best & Friedrich LLP

(57) ABSTRACT

A duty ratio adjusting circuit has a differential buffer (11) to produce a pulse signal (Dout) according to an input sine wave signal (Ain) and a reference voltage. The pulse signal is inverted and filtered to be supplied to a first analog buffer (14) as a direct voltage. The first analog buffer outputs voltage equal to the direct voltage. A second analog buffer (15) has the same structure as the first analog buffer and outputs voltage equal to the reference voltage. A differential amplifying circuit (16) produces an output voltage (SDout) as the reference voltage according to the difference between voltages output from the first and the second analog buffers. Capacitor (17, 19) connected to lines connecting between the first and the second analog buffers and the differential amplifying circuit.

7 Claims, 7 Drawing Sheets

DUTY RATIO ADJUSTING CIRCUIT

This application claims priority to prior application JP 2005-88787, filed Mar. 25, 2005, the disclosure of which is incorporated herein by reference.

BACKGROUND OF THE INVENTION

This invention relates to a duty ratio adjusting circuit, in particular, to a duty ratio adjusting circuit having analog buffer circuits and a differential amplifier.

A conventional duty ratio adjusting circuit is configured to produce two preliminary signals having different phases from an input pulse signal and to produce an output pulse signal by using the preliminary signals.

The conventional duty ratio adjusting circuit has no feedback loop. Accordingly, the conventional duty ratio adjusting circuit has disadvantage that a duty ratio of the output signal is changed by aged deterioration of the components thereof.

Such a duty ratio adjusting circuit is disclosed in Unexamined Japanese Patent Publication No. 5-29893, 9-214307 or P2003-243973A.

Another conventional duty ratio adjusting circuit has a feedback loop in addition to an inverter and a wave shaping buffer. The inverter inverts an input pulse signal and the wave shaping buffer shapes the inverted pulse signal to produce an output pulse signal. The feedback loop serves to control rising and falling times of an output signal of the inverter or a logic threshold voltage of the wave shaping buffer.

However, the conventional duty ratio adjusting circuit has no pair of analog buffers to obtain stable input-output characteristics.

SUMMARY OF THE INVENTION

It is therefore, an object of this invention to provide a duty ratio adjusting circuit having a feedback loop and stable input-output characteristics.

Other objects of this invention will become clear as the description proceeds.

According to an aspect of this invention, a duty ratio adjusting circuit comprises a differential buffer to produce a pulse signal according to a sine wave signal and a reference voltage. An inverter is connected to the differential buffer and inverts the pulse signal to produce an inverted pulse signal. A low pass filter is connected to the inverter and removes high frequency component from the inverted pulse signal to produce direct voltage. A first analog buffer is connected to the low pass filter and has a high input impedance to produce a first buffered voltage substantially equal to the direct voltage supplied from the low pass filter. A second analog buffer has the same configuration as the first analog buffer to produce a second buffered voltage substantially equal to the reference voltage. A differential amplifying buffer is connected to the first and the second buffers and the differential buffer and produces an output voltage according to the first and the second buffered voltages to supply the output voltage to the differential buffer and the second analog buffer as the reference voltage.

The duty ratio adjusting circuit may have capacitors connected between the ground and connection points which are between said first analog buffer and said differential amplifying circuit and between said second analog buffer and said differential amplifying circuit.

DESCRIPTION OF THE PREFERRED EMBODIMENT

Referring to FIGS. 1 to 7, a description will be made about a preferred embodiment of this invention.

Figure 1:
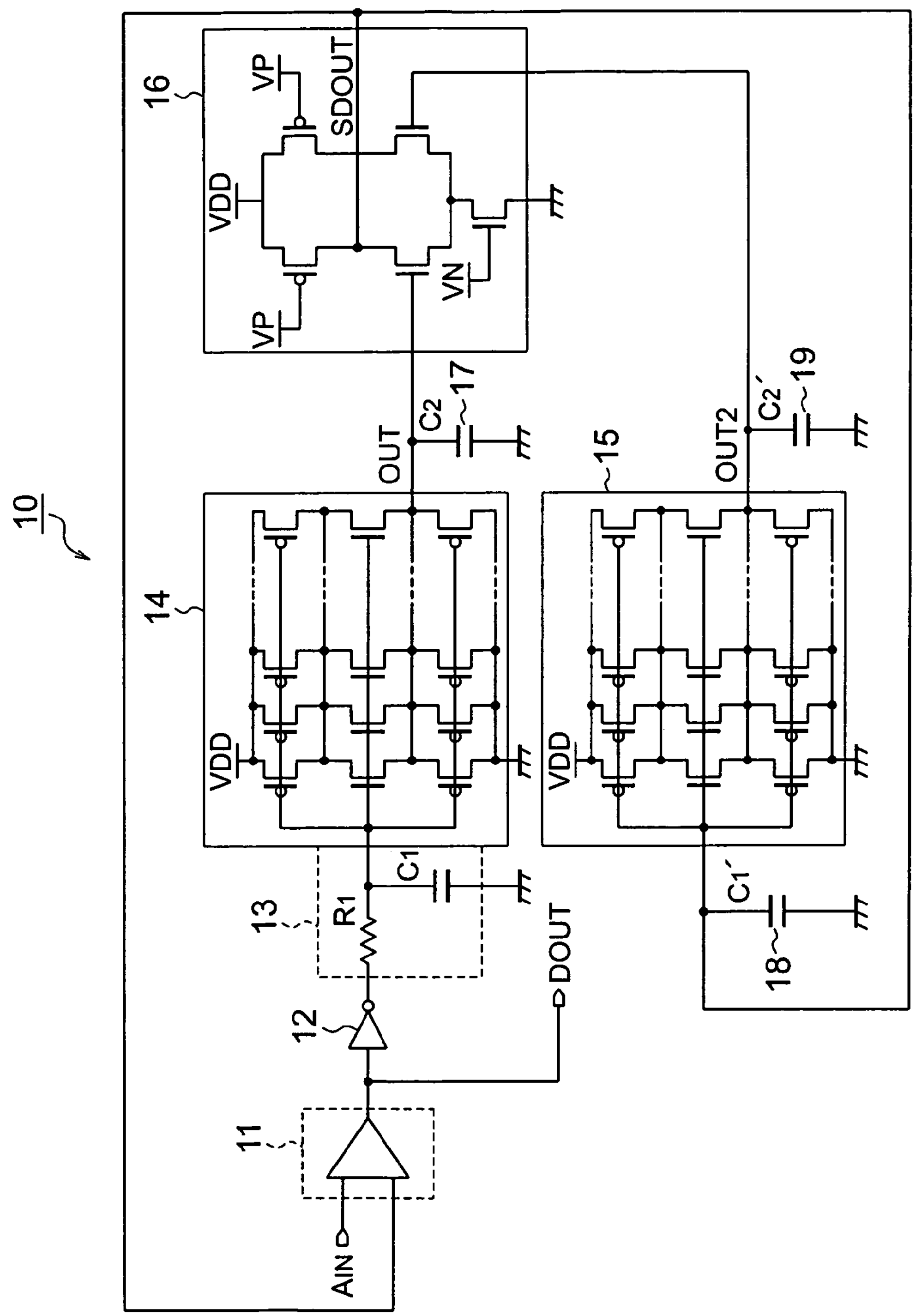
FIG. 1 is a circuit diagram showing a configuration of a duty adjusting circuit according to a preferred embodiment of this invention.

FIG. 1 shows a duty ratio adjusting circuit 10 according to the preferred embodiment. The duty ratio adjusting circuit 10 has a differential buffer 11, an inverter 12, a low pass filter (LPF) 13, first and second analog buffers 14 and 15, a differential amplifying circuit 16 and capacitors 17, 18 and 19.

The differential buffer 11 receives an input sine wave signal Ain and an output voltage (i.e. a reference voltage) SDout of the differential amplifying circuit 16 and produces an output pulse signal Dout according to the input sine wave signal Ain and the reference voltage SDout. The output pulse signal Dout is divided into two, one of them is supplied to a later stage (not shown) and the other is supplied to the inverter 12.

The inverter 12 is connected to the differential buffer 11 to receive the output pulse signal Dout. The inverter 12 executes logical inversion of the output pulse signal Dout supplied from the differential buffer 11.

The LPF 13 is connected to the inverter 12 to remove high frequency component from the output of the inverter 12. For instance, the LPF 13 consists of a resister R1 and a capacitor C1.

The first analog buffer 14 is connected to the LPF 13 and includes a plurality of analog buffer circuits, which will be mentioned later with reference to FIG. 2, connected to one another in parallel to cope with a large output current (or transition current). The first analog buffer 14 produces output voltage equal to the output voltage of the LPF 13.

The second analog buffer 15 is similar to the first analog buffer 14 in configuration. The second analog buffer 15 is connected to the differential amplifier 16 to produce output voltage equal to the reference voltage SDout supplied from the differential amplifying circuit 16.

The capacitor 17 is connected to the first analog buffer 14 and the differential amplifying circuit 16. The capacitors 18 and 19 are connected to the second analog buffer 15 and the differential amplifying circuit 16. The capacitors 17, 18 and 19 integrate voltage on corresponding lines to suppress rapid change of the voltage on the lines. Thus, the capacitors 17 to 19 remove noises on the lines. Therefore, the duty ratio adjusting circuit 10 can executes table operation at high accuracy.

The differential amplifying circuit 16 is connected to the first and the second analog buffers 14 and 15 and the differential buffer 11 to generate the reference voltage SDout according to the difference between the output voltages of the first and the second analog buffers 14 and 15. For instance, the differential amplifying circuit 16 consists of p channel and n channel MOS transistors. The reference voltage SDout is supplied to the differential buffer 11 and the second analog buffer 15 as mentioned above.

In the duty ratio adjusting circuit 10 having above mentioned configuration, if the output pulse signal Dout has a smaller duty ratio smaller than a predetermined value, input voltage of the first analog buffer 14 is increased and thereby output voltage of the first analog buffer 14 is increased. Consequently, the output voltage SDout of the differential amplifying circuit 16 is reduced. The reduction of the output voltage SDout increases the duty ratio of the output pulse signal Dout output from the differential buffer 11.

To the contrary, if the output pulse signal Dout has a larger duty ratio larger than the predetermined value, the input voltage of the first analog buffer 14 is reduced and thereby the output voltage of the first analog buffer 14 is reduced. Consequently, the output voltage SDout is increased. The increase of the output voltage SDout reduces the duty ratio of the output pulse signal Dout.

Additionally, the output voltage SDout of the differential amplifying circuit 16 is returned thereto through the second analog buffer 15. With this structure, the duty ratio adjusting circuit 10 obtains stable input-output characteristics.

Thus, the duty ratio adjusting circuit 10 automatically adjusts the output pulse signal Dout to have the predetermined value of the duty ratio.

Figure 2:
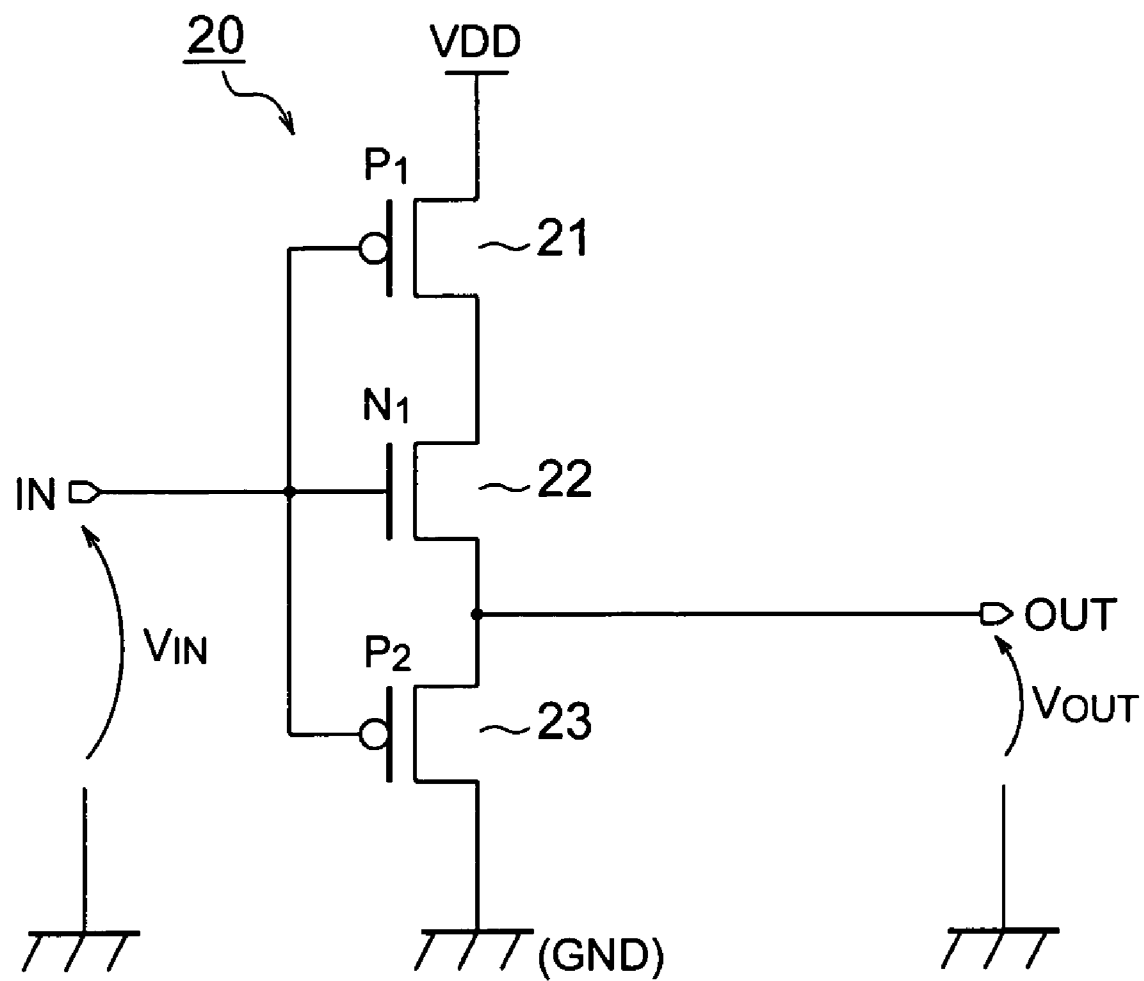
FIG. 2 is a circuit diagram of an analog buffer circuit for use in an analog buffer included in the duty adjusting circuit of FIG. 1.

Next, referring to FIG. 2, the description will proceed to the analog buffer circuit 20 for use in the first and the second analog buffer 14 and 15.

The analog buffer circuit 20 has three field effect transistors (FETs) connected in series between power supply terminals (i.e. between VDD and GND).

In particular, a first p channel MOSFET 21, an n channel MOSFET 22 and a second p channel MOSFET 23 are connected in this order between a high potential side voltage terminal and a low potential side power supply terminal. The high potential side voltage terminal receives high potential side source voltage VDD while the low potential side voltage terminal receives low potential side source voltage GND. The MOSFETs 21, 22 and 23 may be simply called first PMOS, NMOS and second PMOS, respectively.

The MOSFETs 21, 22 and 23 have gates commonly connected to an input terminal IN. An output terminal OUT is connected to a connecting point between the NMOS 22 and the second PMOS 23. With this structure, a current supplied to the input terminal IN does not flow to the output terminal OUT. Accordingly, the analog buffer circuit 20 has high input impedance.

The analog buffer circuit 20 operates as follows.

Supplying input voltage V into the input terminal IN, current flows from the high potential side voltage terminal to the low potential side voltage terminal through the MOSFETs 21, 22 and 23 in response to the input voltage Vin. As a result, an output voltage Vout appears on the output terminal OUT according to the input voltage Vin.

In particular, the first PMOS 21 has a source receives the high potential side source voltage VDD. Accordingly, the first PMOS 21 turns on when the input voltage Vin is smaller than a total of the source voltage VDD and a first threshold voltage Vthp1 for the first PMOS 21. The first PMOS 21 supplies electric potential of a range 0 to VDD [V] to a drain of the NMOS 22 when it turns on. Herein, it is assumed that the input voltage Vin is changed to turn on the first PMOS 21 always.

The NMOS 22 either turns on or off in response to a difference between the input voltage Vin and the output voltage Vout (i.e. a gate-source voltage). That is, if the input voltage Vin is equal to or larger than a total of the output voltage Vout and a threshold voltage Vthn for the NMOS 22, the NMOS 22 turns on. If not, the NMOS 22 turns off.

Similarly, the second PMOS 23 either turns on or off in response to the difference between the input voltage Vin and the output voltage Vout (i.e. a gate-source voltage). The second PMOS 23 turns on differently from the NMOS 22 when the input voltage Vin is smaller than a total of the output voltage Vout and a threshold voltage Vthp2 for the NMOS 23. Otherwise, the NMOS 22 turns off.

Here, it is assumed that the threshold voltages Vthp1, Vthp2 and Vthn are equal to 0 [V]. In this assumption, the first PMOS 21 turns on and supplies the electric potential between 0 and VDD [V] to the drain of the NMOS 22 when the input voltage Vin is smaller than the high source voltage VDD. The NMOS 22 turns on when the input Vin is equal to or lager than the output voltage Vout. The NMOS 22 turns off when the input Vin is smaller than the output voltage Vout. The second PMOS 23 turns off when the input Vin is equal to or smaller than the output voltage Vout. The second PMOS 23 turns on when the input Vin is larger than the output voltage Vout. That is, in this assumption, when the output voltage Vout is smaller than the input voltage Vin, the NMOS 22 turns on while the second PMOS 23 turns off. As a result, the output voltage Vout is increased. To the contrary, when the output voltage Vout is lager than the input voltage Vin, the NMOS 22 turns off while the second PMOS 23 turns on. Consequently, the output voltage Vout is reduced. Thus, the analog buffer circuit 20 matches the output voltage Vout with the input voltage Vin.

Additionally, low input voltage Vin makes drain current of the first PMOS 21 easy to flow while high input voltage Vin makes the drain current difficult to flow. In other words, the low input voltage Vin increases the drain voltage of the NMOS 22 while the high input voltage Vin reduces the drain voltage. Thus, the analog buffer circuit 20 maintains a linear input-output voltage characteristic. When the input voltage Vin is significantly close to the high source voltage VDD, voltage drop at the first PMOS 21 is large and necessary potential is not supplied to the drain of the NMOS 22. In such a case, because the output voltage Vout is smaller than the input voltage Vin, the analog buffer circuit 20 can not maintain the linear input-output voltage characteristic.

By the use of the analog buffer circuit 20 shown in FIG. 2, the buffers 14 and 15 are simplified instructure and miniaturized in comparison with a case of using a conventional analog buffer circuit.

Figure 3:
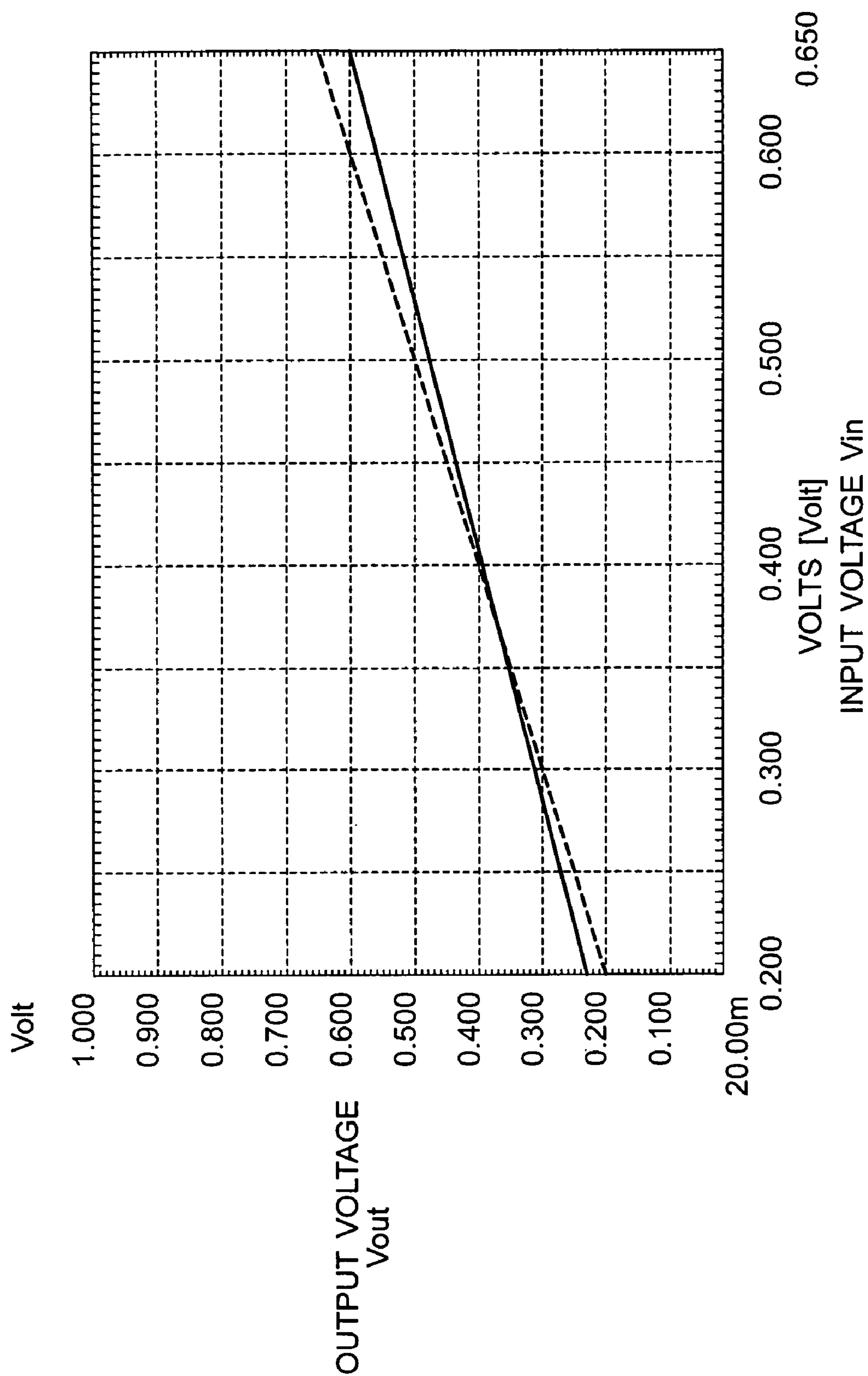
FIG. 3 is a graph showing an input-output voltage characteristic of the analog buffer circuit of FIG. 2, determined by simulation.

FIG. 3 shows a simulation result (represented by a solid line) of the input-output voltage characteristic of the analog buffer circuit 20 shown in FIG. 2. Herein, the high source voltage VDD is equal to 1.0 [V].

As understood from FIG. 3, the output voltage Vout is proportional to the input voltage Vin which is in a range from 0.2 to 0.65 [V]. A difference between the input voltage Vin and the output voltage Vout is smaller than about 10% of the input voltage Vin. Accordingly, it can be considered that the output voltage Vout is substantially equal to the input voltage Vin. Thus, the analog buffer circuit 20 produces the output voltage Vout substantially equal to the input voltage Vin.

FIGS. 4 to 7 show a simulation result of voltage changes at predetermined points in the duty ratio adjusting circuit 10.

Figure 4:
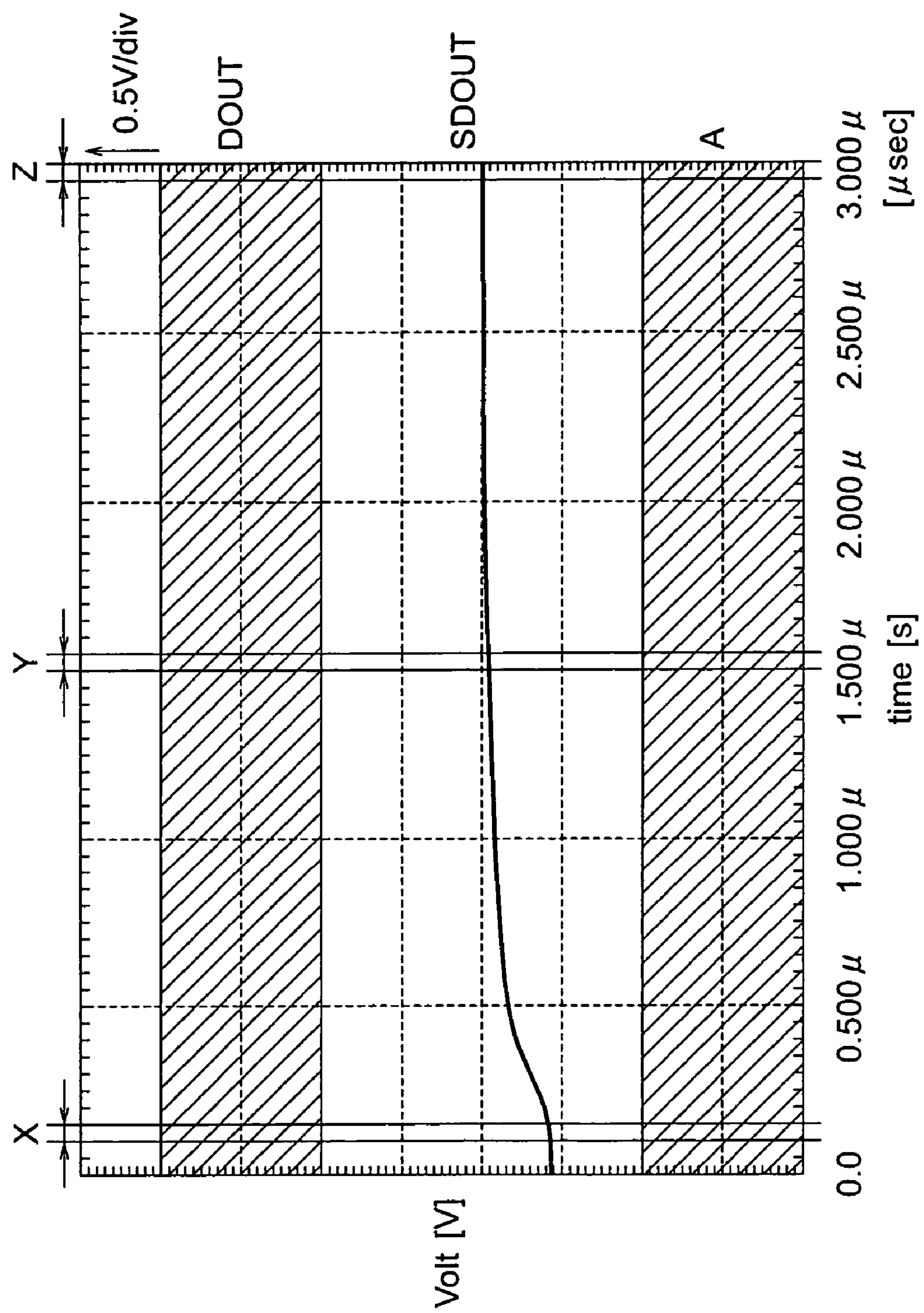
FIG. 4 is a graph showing voltage variations of an input signal Ain, an output voltage SDout and an output pulse signal Dout of the duty adjusting circuit of FIG. 1.

In particular, FIG. 4 is a graph showing changes of the input signal Ain, the output pulse signal Dout and the output voltage SDout during 3 [μsec] from a point of starting operation. However, the input signal Ain and the output pulse signal Dout are represented by hatching which corresponds to their amplitudes. This is because the input signal Ain and the output pulse signal Dout have very short cycles (or high frequencies about 250 MHz).

As understood from FIG. 4, the output voltage SDout converges to a predetermined value with the course of time.

Figure 5:
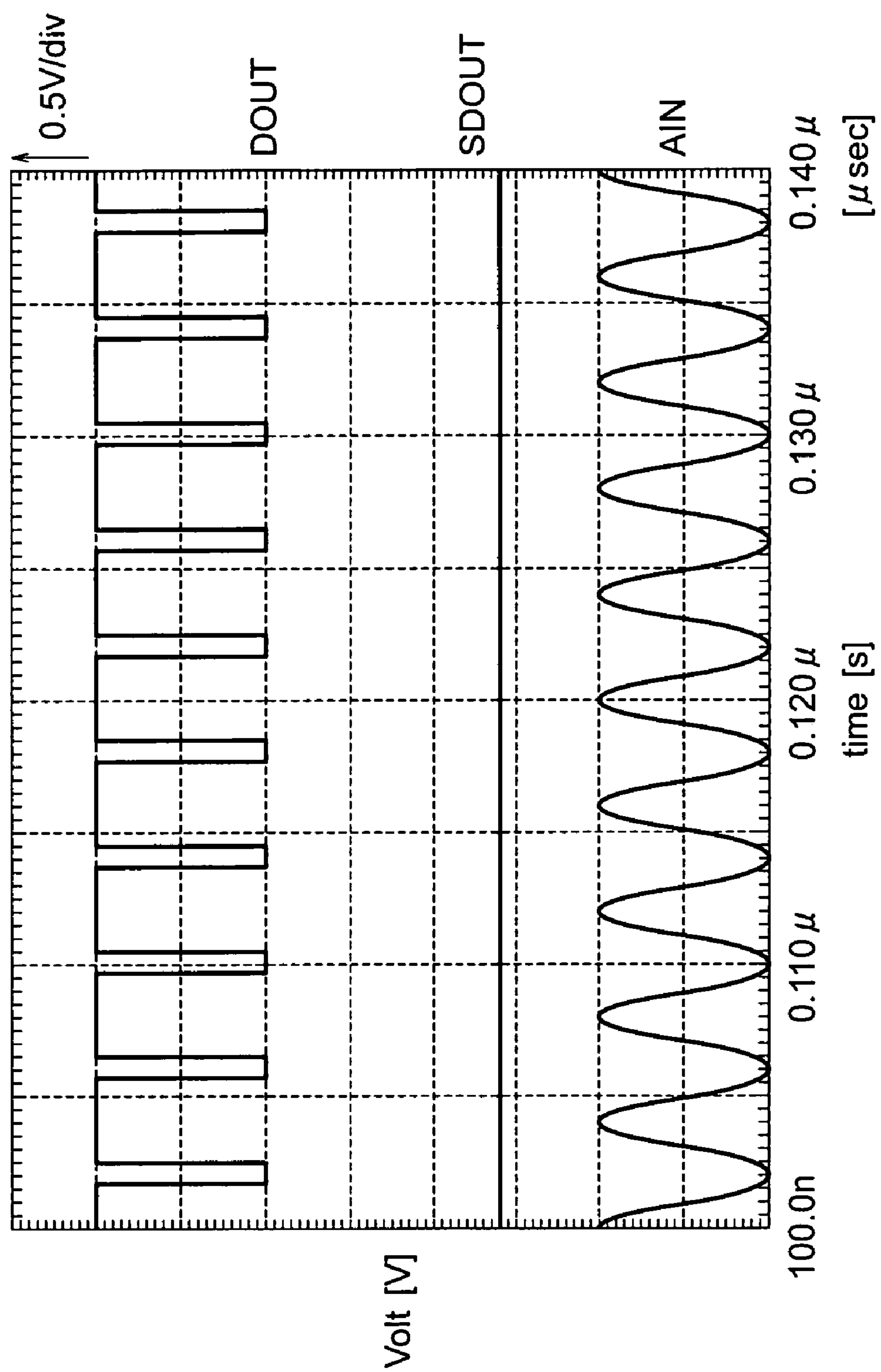
FIG. 5 is an expanded graph of a time period X of FIG. 4, expanded along the time axis.
Figure 6:
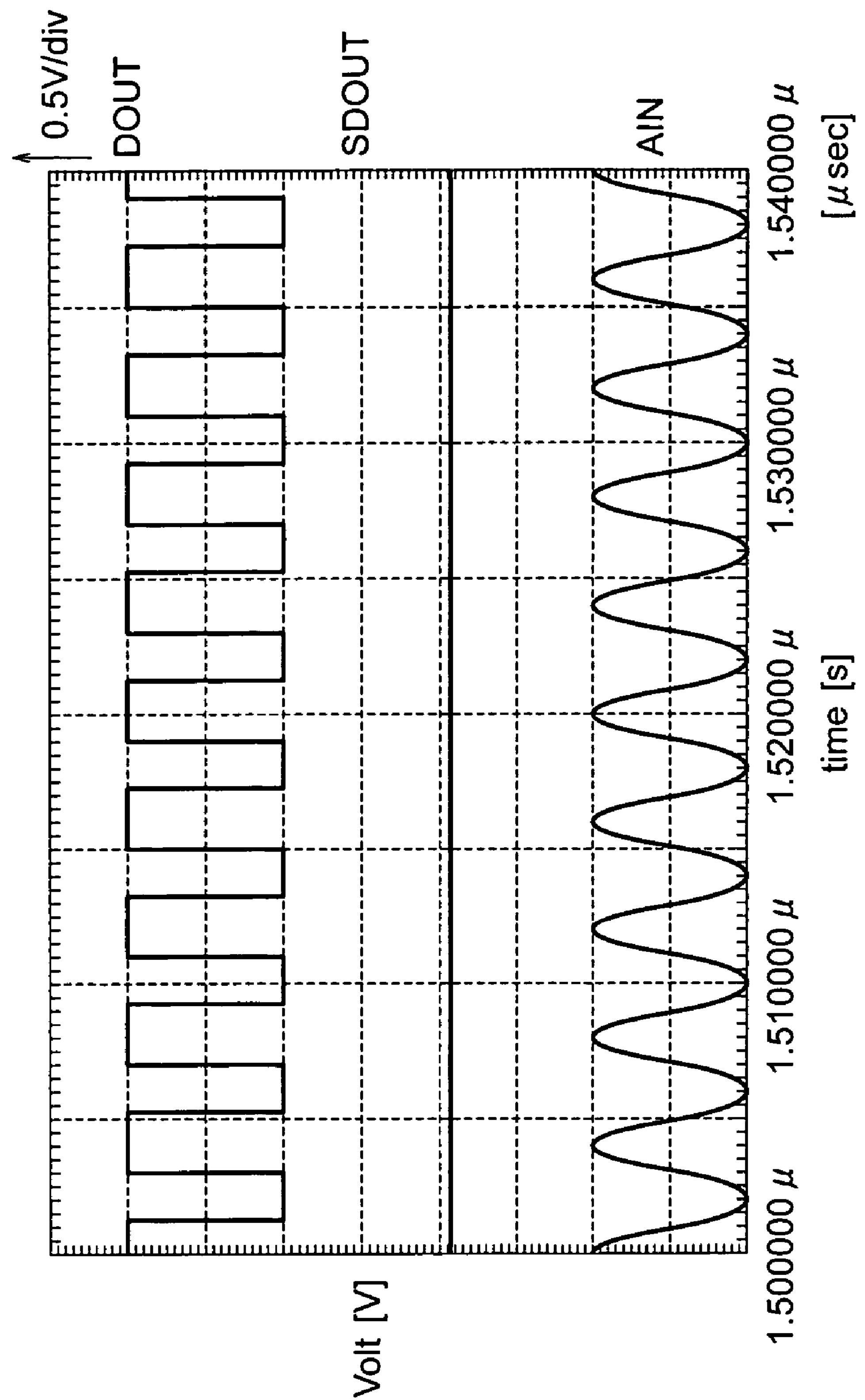
FIG. 6 is an expanded graph of a time period Y of FIG. 4, expanded along the time axis.
Figure 7:
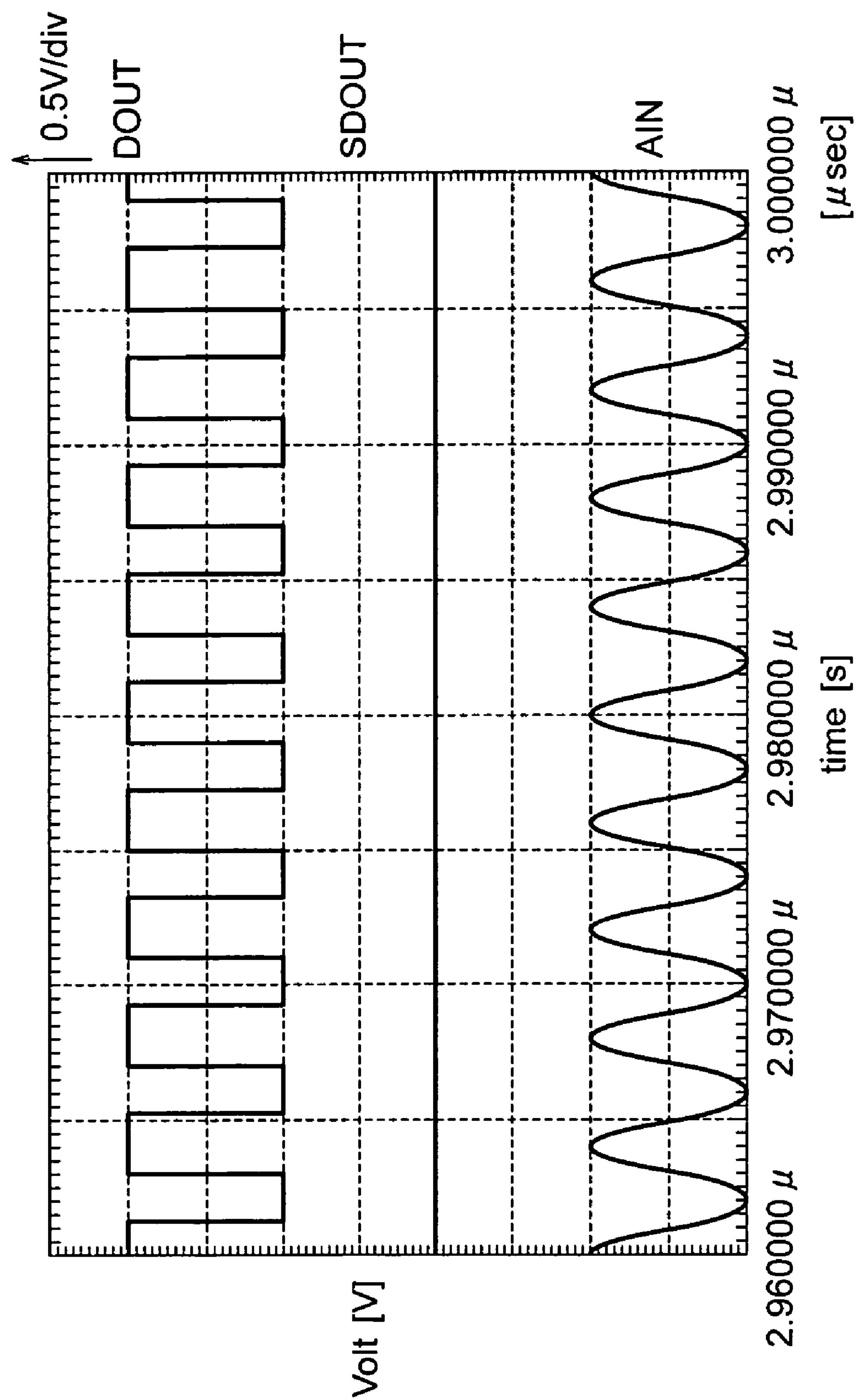
FIG. 7 is an expanded graph of a time period Z of FIG. 4, expanded along the time axis.

FIGS. 5 to 7 correspond to periods X, Y and Z of FIG. 4, respectively. As understood from comparison of FIGS. 5 to 7, the input signal Ain has an unchanged wave form. On the other hand, the output voltage SDout is increased by lapse of time. The duty ratio of the output pulse signal Dout is reduced as the output voltage SDout is increased. In other words, the duty ratio of the output pulse signal Dout converges to a prescribed value according to the convergence of the output voltage SDout.

While this invention has thus far been described in conjunction with the preferred embodiment thereof, it will readily be possible for those skilled in the art to put this invention into practice in various other manners. For example, the analog buffer 14 maybe configured by transistors different from MOSFETs. The analog buffer 14 may be designed to achieve a linear input-output characteristic regarding a different range of the input voltage.

What is claimed is:

1. A duty ratio adjusting circuit comprising:

a differential buffer for producing a pulse signal according to a sine wave signal and a reference voltage;

an inverter connected to said differential buffer for inverting the pulse signal to produce an inverted pulse signal;

a low pass filter connected to said inverter for removing high frequency component from the inverted pulse signal to produce direct voltage;

a first analog buffer connected to said low pass filter and having a high input impedance for producing a first buffered voltage substantially equal to the direct voltage supplied from said low pass filter;

a second analog buffer having the same configuration as said first analog buffer for producing a second buffered voltage substantially equal to the reference voltage;

a differential amplifying buffer connected to said first and said second buffers and said differential buffer for producing an output voltage according to the first and the second buffered voltages to supply the output voltage to said differential buffer and said second analog buffer as the reference voltage.

2. A duty ratio adjusting circuit as claimed in claim 1, further comprising:

capacitors connected between the ground and connection points which are between said first analog buffer and said differential amplifying circuit and between said second analog buffer and said differential amplifying circuit.

3. A duty ratio adjusting circuit as claimed in claim 1, wherein said first analog buffer includes an analog buffer circuit having three field effect transistors and having an approximately linear input-output voltage characteristic.

4. A duty ratio adjusting circuit as claimed in claim 3, further comprising an additional analog buffer having the same structure to be connected to said analog buffer in parallel.

5. A duty ratio adjusting circuit as claimed in claim 3, wherein each of said field effect transistors comprising a metal oxide semiconductor field effect transistor.

6. A duty ratio adjusting circuit as claimed in claim 3, wherein said field effect transistors are connected between power supply terminals in series and have gates connected to an input terminal in common.

7. A duty ratio adjusting circuit as claimed in claim 6, wherein said field effect transistors comprises two p channel field effect transistors and an n channel field effect transistor connected between said p channel field effect transistors, said n channel field effect transistor having a drain connected to an output terminal.

* * * * *